US008244642B2

(12) United States Patent
Moore et al.

(10) Patent No.: US 8,244,642 B2
(45) Date of Patent: Aug. 14, 2012

(54) SYSTEM AND METHOD FOR STORING METERING DATA WHILE INCREASING MEMORY ENDURANCE

(75) Inventors: Michael E. Moore, Central, SC (US); Jocelyn Bilodeau, Walhalla, SC (US)

(73) Assignee: Itron, Inc., Liberty Lake, WA (US)

( * ) Notice: Subject to any disclaimer, the term of this patent is extended or adjusted under 35 U.S.C. 154(b) by 733 days.

(21) Appl. No.: 11/821,081

(22) Filed: Jun. 21, 2007

(65) Prior Publication Data

US 2008/0010212 A1 Jan. 10, 2008

Related U.S. Application Data

(60) Provisional application No. 60/815,799, filed on Jun. 22, 2006.

(51) Int. Cl.
*H04L 9/00* (2006.01)
(52) U.S. Cl. ........................................................ 705/63
(58) Field of Classification Search .................. 705/50, 705/63
See application file for complete search history.

(56) References Cited

U.S. PATENT DOCUMENTS

| | | | |
|---|---|---|---|
| 4,150,535 A * | 4/1979 | Morokawa et al. | 368/156 |
| 4,516,218 A | 5/1985 | Hamilton | |
| 4,574,355 A * | 3/1986 | Beatty et al. | 700/295 |
| 4,746,854 A * | 5/1988 | Baker et al. | 320/130 |
| 5,448,719 A * | 9/1995 | Schultz et al. | 714/5.11 |
| 5,477,216 A | 12/1995 | Lee, Jr. et al. | |
| 6,006,212 A | 12/1999 | Schleich et al. | |
| 6,014,755 A * | 1/2000 | Wells et al. | 714/6.13 |
| 6,145,092 A * | 11/2000 | Beffa et al. | 714/6.32 |
| 6,219,656 B1 | 4/2001 | Cain et al. | |
| 6,374,188 B1 | 4/2002 | Hubbard et al. | |
| 6,507,794 B1 | 1/2003 | Hubbard et al. | |
| 6,577,961 B1 | 6/2003 | Hubbard et al. | |
| 6,735,679 B1 * | 5/2004 | Herbst et al. | 711/167 |
| 6,798,353 B2 | 9/2004 | Seal et al. | |
| 7,317,537 B2 * | 1/2008 | Haque | 356/460 |
| 2003/0065459 A1 * | 4/2003 | Huber et al. | 702/62 |
| 2005/0036387 A1 * | 2/2005 | Seal et al. | 365/222 |
| 2007/0086014 A1 * | 4/2007 | Haque | 356/460 |

FOREIGN PATENT DOCUMENTS

WO WO2007139842 A2 * 12/2007

OTHER PUBLICATIONS

Lekhanont et al. ("Error Analyses of a 3-Phase Electricity Meter with Class-0.5 Accuracy", Department of Electrical Engineering, Faculty of Engineering, Chulalongkorn University, TENCON 2004, 2004 IEEE Region 10 Conference, 4 pages).*

* cited by examiner

*Primary Examiner* — James D Nigh
(74) *Attorney, Agent, or Firm* — Dority & Manning, P.A.

(57) ABSTRACT

Methodology and corresponding apparatus ensure the integrity of utility metering data during power outages while providing improved memory integrity. An initial step includes determining and storing an energy top value that is representative of metered energy, and also includes establishing an update pattern. Accumulated energy is then monitored until a predetermined energy threshold is crossed, at which point a selected state in the update pattern is stored into one of a plurality of energy increment cells. Such stored value can be validated at some point after the data read. The steps of monitoring accumulated energy and storing a selected value/state of the update pattern into additional energy increment cells continue until each of the plurality of energy increment cells is updated with a new value. Upon completion, the energy top value is updated with a new energy total and the process of cycling through each energy increment cell is repeated.

25 Claims, 3 Drawing Sheets

SYSTEM AND METHOD FOR STORING METERING DATA WHILE INCREASING MEMORY ENDURANCE

PRIORITY CLAIM

This application claims the benefit of previously filed U.S. Provisional Patent Application entitled "SYSTEM AND METHOD FOR STORING METERING DATA WHILE INCREASING MEMORY ENDURANCE," assigned U.S. Ser. No. 60/815,799, filed Jun. 22, 2006, and which is fully incorporated herein by reference for all purposes.

FIELD OF THE INVENTION

This disclosure generally relates to utility meters, and more specifically concerns improved processes or techniques for ensuring the integrity of metering data during power outages. The presently disclosed technology generally, and more particularly concerns improved memory integrity and endurance of electricity meters such that accurate metrology data is stored. In such context, the present subject matter equally concerns both apparatus and methodology in such areas, including the use of practical computer software and/or firmware applications involving an algorithm-based approach to producing a useful, concrete and tangible result, i.e., namely a stored data value for consumed electricity or other metered utility commodity or service to be charged to a customer's account.

BACKGROUND OF THE INVENTION

The general object of metrology (i.e., the science of measurement) is to monitor a physical phenomenon to permit a record of the monitored event(s). If the potential to record the measured or monitored data is lost, then the entire basic purpose of the metering device and/or effort fails.

The basic function and purpose of metering devices can be applied to a number of contexts. One broad area of measurement relates, for example, to utility meters. These may include the monitoring of consumption of a variety of forms of energy or other commodities, such as electricity, water, gas, and oil, just to name a few.

Intermittent power outages (or other conditions, including brown outs) can occur in even the most well maintained systems. For example, an electrical power system can become damaged due to storm debris (e.g., falling limbs) or high winds, or from an accident (for example, vehicles such as trucks or cars knocking down utility poles and power lines). Under certain load shedding conditions, it may even become necessary for power to a given location to be deliberately interrupted.

Regardless of such relatively routine causes (or possibly other less routine sources) of power outages, an inherent problem is that an electrical measuring device with electrically powered metrology and memory storage registers may lose accumulated data in the event of even a routine power outage. Prior attempts have been made to address the technical problem of saving data at power down in a solid state metering platform.

One known method of addressing the issue of memory integrity during instances of lost power employs a technique or storage algorithm that stores electricity meter quantities to a non-volatile memory whenever a power outage occurs. In such approach, the technique involved the use of what may be relatively complicated and costly power fail detection circuits and power supply hold up components. A relatively significant storage capacitance is required to store the necessary energy increments to complete a non-volatile memory write after a power failure has been detected.

Another known method of addressing such present issues involves saving metered energy values at fixed time or energy intervals. Such approach has been practiced such that if the power fails during the energy write, the integrity of the metered data is not compromised. Such technique provides a relatively lower risk of data loss compared to the power fail detection technique. However, the relative endurance of non-volatile memory devices becomes a concern because most non-volatile memory devices are limited over the life of such a device by the maximum number of times to which an area of memory can be written.

There are other known efficient and affordable non-volatile memory technologies used in many electronics applications, including metrology. Such known technologies include EEPROM (Electronically Erasable Programmable Read Only Memory) and flash memory. An exemplary method of using flash memory for storing metering data is disclosed in U.S. Pat. No. 6,798,353 B1 (Seal et al.). It should be noted that other applications may utilize alternative non-volatile memory structures such as EPROMS, other ROM devices, certain types of RAM, namely battery-backed RAM, or others. The number of times a non-volatile memory device such as EEPROM or flash can be erased and then rewritten is limited over the lifetime of such devices. Such limiting phenomenon is known as memory "endurance", and is often measured by a limited defined number of "writes". For example, many conventional EEPROM devices may support about one million writes, while many typical flash structures may support between ten-thousand and one-hundred-thousand writes.

Known references have addressed exemplary procedures and algorithms for increasing memory endurance and integrity. For example, U.S. Pat. No. 6,219,656 B1 (Cain et al.) discloses a technique that alternates saved metering data between two EEPROM locations, thus doubling the endurance of the memory device.

Other arrangements and aspects of memory storage in electronic-based electricity meters are known. See, for example, disclosures set forth in U.S. Pat. Nos. 4,516,218 (Hamilton); 5,477,216 (Lee, Jr. et al.); 6,006,212 (Schleich et al.); 6,374,188 B1 (Hubbard et al.); 6,507,794 B1 (Hubbard et al.); and 6,577,961 B1 (Hubbard et al.).

The disclosures of all of the above-referenced patents are incorporated herein for all purposes by virtue of present reference thereto.

While useful for their purposes, none of the above referenced approaches solve the problems addressed by the presently disclosed technology, namely, the need for a cost-effective, efficient, non-volatile memory structure and associated methodology used to store metering data while also ensuring memory integrity and increasing memory endurance.

BRIEF SUMMARY OF THE INVENTION

The present subject matter recognizes and addresses various of the foregoing limitations and drawbacks, and others, concerning the storage of measured metering data and the maintenance of that data during a loss of power. Therefore, one general object of the presently disclosed technology is to provide improved methodology and corresponding structures for ensuring the integrity of metering data during power outages. Another more particular present object is to provide improved memory integrity and endurance of electricity meters such that accurate metrology data is stored.

Many objects and advantages of the present subject matter are set forth in, or will be apparent to those of ordinary skill in the art from, the detailed description herein. Also, it should be further appreciated that modifications and variations to the specifically illustrated and discussed steps, features, and materials, or devices hereof may be practiced in various embodiments and uses of the disclosed technology without departing from the spirit and scope thereof, by virtue of present reference thereto. Such variations may include, but are not limited to, substitutions of equivalent steps, elements, features, and materials for those shown or discussed, and the functional or positional reversal of various steps, parts, features, or the like.

Still further, it is to be understood that different embodiments, as well as different presently preferred embodiments, of the present subject matter may include various combinations or configurations of presently disclosed steps, features, elements, or their equivalents (including combinations of features or configurations thereof not expressly shown in the Figures or stated in the detailed description).

One advantage afforded by aspects of the present technology corresponds to provision of a system and method of data storage for a utility meter or other processing application that stores metering information in a generally low-cost and efficient memory device (e.g., an EEPROM) without the need for additional circuitry such as power failure detection circuitry or expensive storage capacitance necessary to store energy required to complete a non-volatile write after losing power. Such advantages are accomplished in part by selecting a small energy increment value and corresponding energy threshold such that the incremental value is small enough not to affect the accuracy of values being stored if lost at some point during the metering or data storage process.

An additional advantage of the present technology is that the amount of memory needed for storing meter consumption data is reduced compared to known systems, requiring less than 200 bytes of memory capacity in one embodiment. This is accomplished by writing a new energy value only periodically and updating a plurality of energy increment cells in between each new energy value update. The period of time between updates is dependent on the number of energy increment cells employed.

In accordance with one exemplary embodiment of the present subject matter, a method for storing meter data includes an initial step of determining and storing an energy top value that is representative of metered energy. An update pattern (including values referred to herein as NextCell values) is also established. Accumulated energy is then monitored until a predetermined energy threshold is crossed, at which point a selected state in the update pattern is stored into one of a plurality of energy increment cells. The value can be validated at some point after the data read. The steps of monitoring accumulated energy and storing a selected value/state of the update pattern into additional energy increment cells continue until each of the plurality of energy increment cells is updated with a new value. Upon completion, the energy top value is updated with a new energy total and the process of cycling through each energy increment cell repeats.

In some exemplary embodiments, features are provided to account for possible situations when writing to an energy increment location fails. A predetermined number of write attempts may occur before a given energy increment cell location will be skipped. New energy top values are determined by a formula that accounts for the number of energy increment cells that are successfully updated and those cells that are not.

In one exemplary embodiment, energy increment cells correspond to only a single byte of storage space, thus reducing previous memory storage requirements by a factor of 172 relative to previous embodiments. It should be appreciated that such increase in memory space and endurance may vary with different embodiments in accordance with the present subject matter, and may range, for example, between a factor of 10 to a factor of 1000.

It should be further understood by those of ordinary skill in the art that the present subject matter equally applies to disclosed methodology and corresponding structures and devices for practicing the present subject matter.

One exemplary such method relates to a method of data storage for a utility meter or other processing application that stores metering information, for ensuring the integrity of metering data during power outages. Such exemplary method may preferably comprise providing a utility meter or other processing application for metering consumption of a commodity, and having memory components which are operated with a predetermined storage and update routine. In such exemplary methodology, preferably such storage and update routine includes providing such memory components with a designated top value storage cell and a plurality of designated incremental storage cells; obtaining and storing initial metering data of the consumed commodity in such top value storage cell of the memory components; accumulating subsequent data regarding the commodity being consumed; monitoring such accumulating subsequent data for reaching a predetermined consumption threshold; and updating a predetermined state in an incremental storage cell of the plurality of incremental storage cells once such predetermined consumption threshold is reached.

In additional alternative embodiments of such exemplary methodology, such storage and update routine may further include repeating the accumulating, monitoring, and updating steps until each of the plurality of incremental storage cells have respectively been updated. Such further alternatives thereof may relate to further including updating the top value storage cell upon completion of updating steps for each of the plurality of incremental storage cells; and repeating the accumulating, monitoring, and updating steps after completion of updating the top value storage cell.

Still further alternative present such methodologies may include various aspects of validating different storage cell values. In further addition, such storage and update routine may alternatively further include repeating the update step if updating of a given incremental storage cell fails, and subsequently calculating metering information by accounting for the number of incremental storage cells which are successfully updated and the number thereof which are not.

In still further exemplary present methodologies, a method for operation of an electricity meter may be provided that ensures the integrity of metering data without the need for power failure detection circuitry or storage capacitance for energy required to complete a non-volatile write after losing normal operating power from a primary source. Such exemplary present method may comprise providing an electronic electricity meter having metrology means for metering consumed energy in predetermined increments and producing corresponding metering data, and having memory means for controllably storing metering data from such metrology means, such memory means having a designated top value storage cell and an ordered plurality of designated incremental storage cells. Preferably, such electricity meter may operate to obtain and store initial metering data of consumed energy in such top value storage cell of said memory means; accumulate subsequent data regarding consumed energy;

monitor accumulated subsequent data for reaching a predetermined consumption threshold; update a predetermined value in a predetermined next one of such plurality of incremental storage cells once such predetermined consumption threshold is reached; repeat the accumulate, monitor, and update operations until each of the plurality of incremental storage cells have respectively been updated; update the top value storage cell with an updated energy total once each of the plurality of incremental storage cells has been respectively updated; and thereafter repeat the updating of each respective one of the plurality of incremental storage cells. In the foregoing exemplary methodology, the relative size of the predetermined increments of consumed energy is preferably selected such that any marginal loss thereof due to loss at such electricity meter of normal operating power from a primary source does not adversely affect the accuracy of consumed energy metered with such electricity meter.

In such exemplary present methodology, such electronic electricity meter may preferably include algorithm-based operation thereof, implemented in one of software, firmware, hardwired, and mixtures thereof, and while such electronic electricity meter may be one of a single phase and multi phase meter. In still further alternative arrangements thereof, such exemplary electronic electricity meter may be configured to receive power input from one of a power grid and a power distribution system, and further may have an electronic register for outputting electricity meter quantities or data, including metering data including at least one of load profiles, energy data, time-of-use data, informational data, error/event/history logs, and self-reads, with such data being collected and stored for later retrieval by at least one of authorized field personnel and transmission to a location remote from such meter.

In various alternatives of such foregoing methodologies, such memory components or memory means may include at least one of non-volatile EEPROM memory, volatile RAM memory, server databases, magnetic tape, magnetic disk, CD-ROM, DVD-ROM, EPROMS, other ROM devices, battery-backed RAM, flash memory, and other storage media. Still further, a predetermined sequence of the locations of the predetermined next ones of such plurality of incremental storage cells is stored in such memory means or memory components. In various alternatives of the foregoing, preferably in some alternatives thereof such electricity meter operation may further include determining metering data after a power loss by utilizing metering data stored in the top value storage cell, and predetermined values stored in such plurality of incremental storage cells.

Still further present exemplary embodiments relate to corresponding devices relative to the foregoing. One present exemplary device relates to a utility meter with ensured metering data integrity during power outages, comprising: memory components having a designated top value storage cell portion and a portion thereof for a plurality of designated incremental storage cells; and a metrology processor for metering consumption at such utility meter of a commodity, obtaining and storing initial metering data of such consumed commodity in such top value storage cell of such memory components, accumulating subsequent data regarding the commodity being consumed, monitoring such accumulating subsequent data for reaching a predetermined consumption threshold, and updating a predetermined state in one of such plurality of incremental storage cells once such predetermined consumption threshold is reached.

In various alternatives of the foregoing, such metrology processor may be further operative for repeating such accumulating, monitoring, and updating operations thereof until each of such plurality of incremental storage cells have respectively been updated.

Still further, in some present embodiment alternatives, such exemplary metrology processor may be yet further operative for repeating the accumulating, monitoring, and updating operations thereof after completion of updating the top value storage cell. In some alternatives of the foregoing embodiments, such plurality of designated incremental storage cells may comprise an ordered plurality of designated incremental storage cells; and such metrology processor may be operative for metering consumed energy in predetermined increments and for operating to repeat such accumulating, monitoring, and updating operations thereof until each of such plurality of incremental storage cells have respectively been updated; and further for operating to update such top value storage cell portion with an updated energy total once each of such plurality of incremental storage cells has been respectively updated; and operative thereafter for repeating the updating of each respective one of such plurality of incremental storage cells.

In other present exemplary alternatives, such exemplary metrology processor may include an algorithm-based implementation of operations thereof, implemented in one of software, firmware, hardwired, and mixtures thereof; and such utility meter may be one of a single phase and multi phase meter. In other present exemplary alternatives, such memory components may include at least one of non-volatile EEPROM memory, volatile RAM memory, server databases, magnetic tape, magnetic disk, CD-ROM, DVD-ROM, EPROMS, other ROM devices, battery-backed RAM, flash memory, and other storage media. Still further, such predetermined state of such incremental storage cells may respectively correspond to at least one byte in such memory components.

These and other features, aspects and advantages of the present technology will become better understood with reference to the following description and appended claims. The accompanying drawings, which are incorporated in and constitute a part of this specification, illustrate an exemplary embodiment of the present subject matter and, together with the description, serve to explain the principles of the presently disclosed technology.

BRIEF DESCRIPTION OF THE DRAWINGS

A full and enabling disclosure of the present subject matter, including the best mode thereof, directed to one of ordinary skill in the art, is set forth in the specification, which makes reference to the appended Figures, in which.

Figure 1:
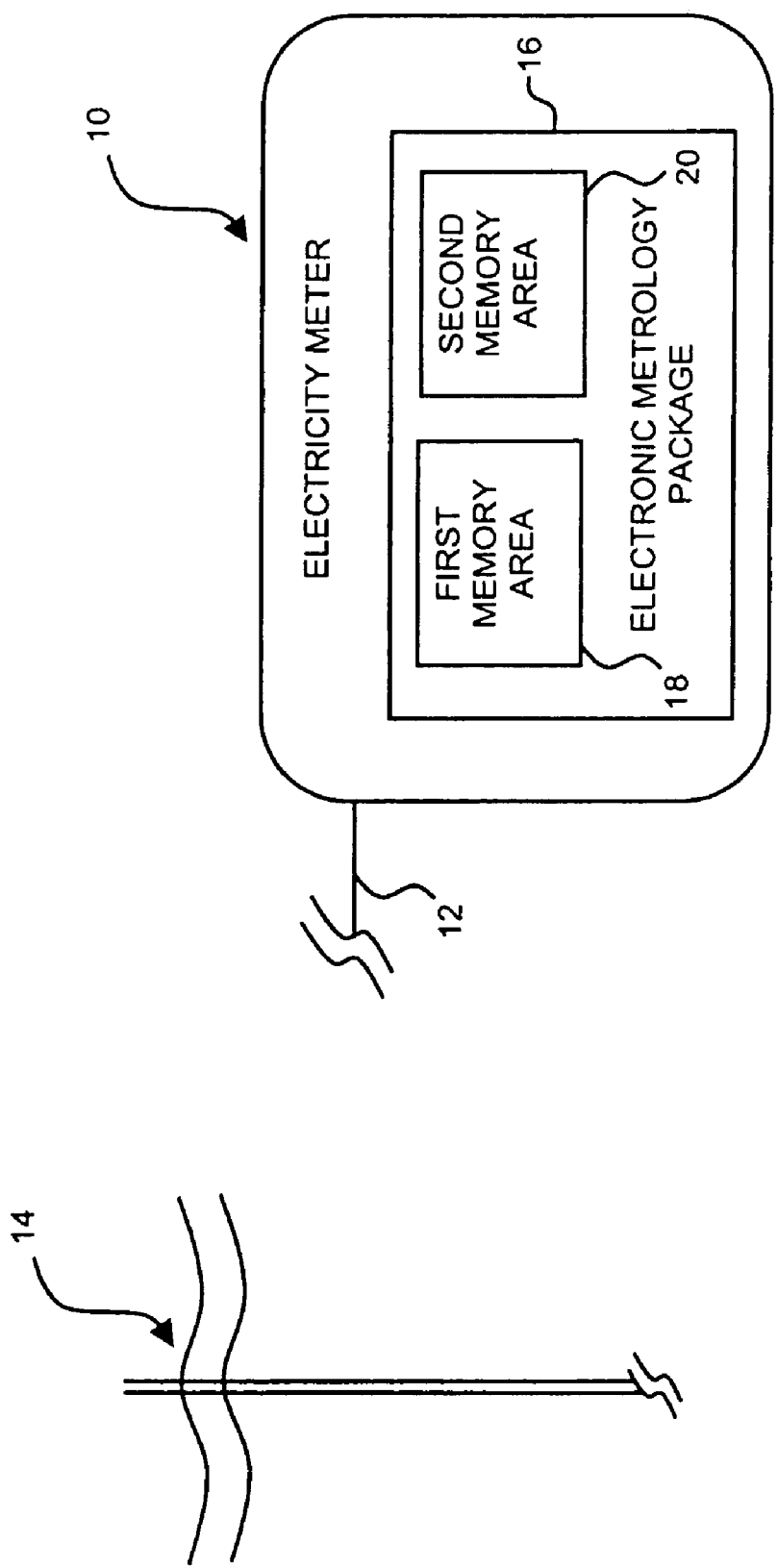
FIG. 1 provides a block schematic representation of certain aspects of the presently disclosed technology, particularly representing exemplary physical components for use in an exemplary metering embodiment.

Repeat use of reference characters throughout the present specification and appended drawings is intended to represent the same or analogous features, steps or elements of the disclosed technology.

DETAILED DESCRIPTION OF THE PREFERRED EMBODIMENTS

Reference will now be made in detail to presently preferred embodiments of the disclosed technology, examples of which are fully represented in the accompanying drawings. Such examples are provided by way of an explanation of the present technology, not limitation thereof. In fact, it will be apparent to those skilled in the art that various modifications and variations can be made in the present subject matter, without departing from the spirit and scope thereof. For instance, features or steps illustrated or described as part of one embodiment can be used on another embodiment to yield a further embodiment. Still further, variations in selection of materials and/or characteristics may be practiced, as well as, alteration in some instances of some of the order of method steps to satisfy particular desired user criteria. Thus, it is intended that the present subject matter cover such modifications and variations as come within the scope of the present features and their equivalents.

FIG. 1 broadly represents in block diagram schematic form various aspects of the present subject matter (including various computer software, firmware and/or hardwired configurations thereof). Such configuration generally depicts such aspects as associated in an exemplary application environment for metering of electrical energy. However, it should be appreciated that such basic configurations and metering principles can be applied to monitoring the generation, transmission, distribution and/or consumption of a number of various forms of products and services, including but not limited to other types of energy or other commodities, such as electricity, water, gas, and oil. Metering may also occur in commercial polyphase or residential single phase or other environments. Further, although reference herein may be directed to an exemplary electricity meter with particular features thereof, the subject exemplary data storage and memory utilization algorithm may be employed with other meters or with different processing applications, either meter-related or in conjunction with other more general applications.

In the example of an electricity meter as represented in FIG. 1, a meter or metering device generally 10 may receive power input generally 12 from such as a power grid or power distribution system, as represented by schematic power lines 14. Otherwise incorporated within metering device 10 or associated therewith may be an electronic metrology package or processing device portion or component 16.

As understood by those of ordinary skill in the art from the present disclosure, such processing device portion 16 may include or be associated with an electronic register for outputting electricity meter quantities or data. Various metering data may include, for example, such information as corresponding to load profiles, energy data, time-of-use data, informational data, error/event/history logs, and/or self-reads. All such data may variously be collected and stored for later retrieval either by authorized field personnel or via transmission to a location remote from the meter. Such information is often used, for example, to better determine appropriate billing rates both for various time periods during any 24 hour period, as well as, alternative billing rates for residential versus commercial users, and/or for variations in demand from season to season.

In some applications, a meter runs continuously while amassing relatively large amounts of data, such as event logs or log profiles. In still further metering applications, metered data such as watt-hours (in the case of electricity metering) continuously change based on consumption of distribution levels at a user location. Selected portions of such metering data may be stored in portions of memory located within electronic metrology package 16. As will be discussed later in more detail, such memory includes at least first and second respective portions or areas of memory 18 and 20.

Figure 2:
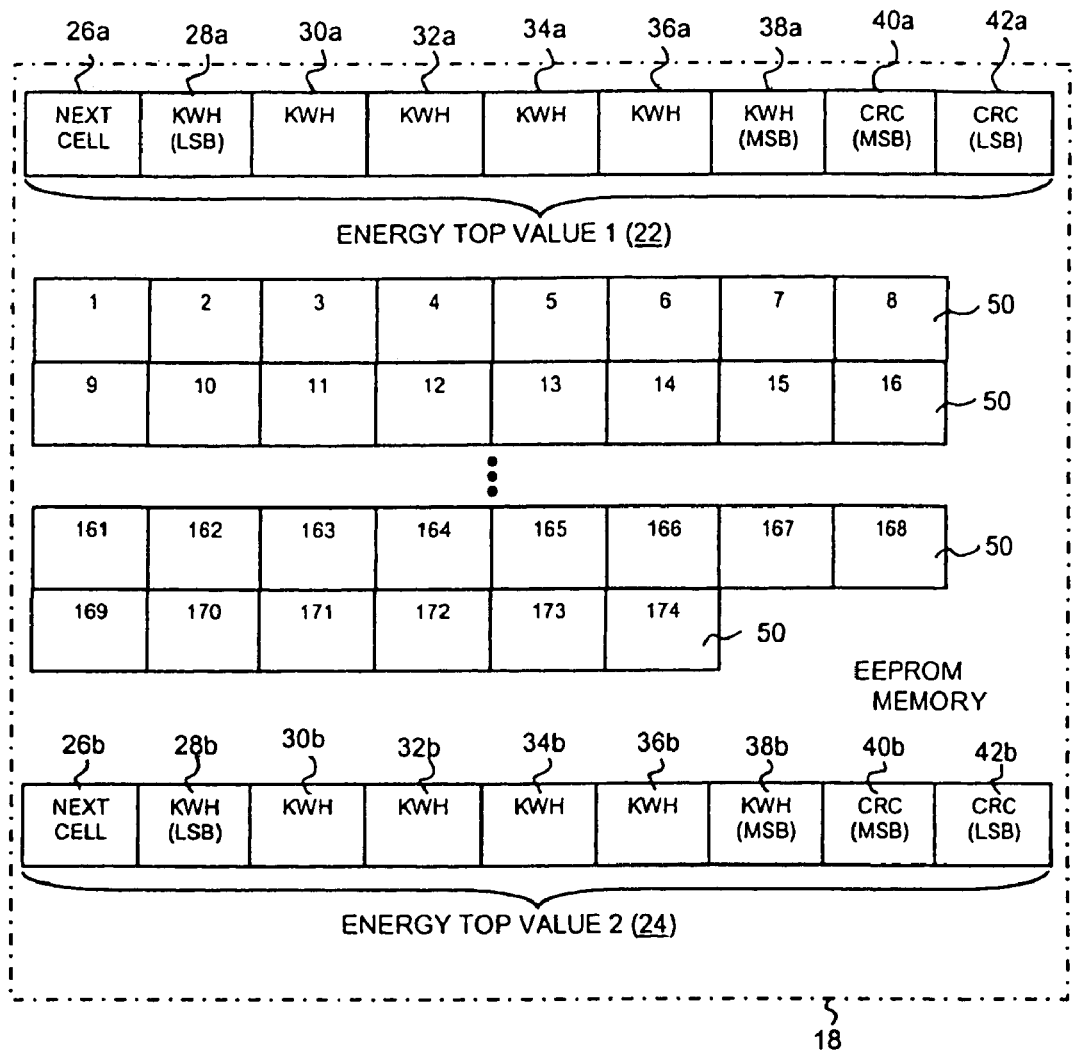
FIG. 2 provides a block schematic representation of exemplary memory areas for use in accordance with aspects of the presently disclosed data storage technology.

Referring now to FIG. 2, first and second memory areas are generally depicted by the respective dashed blocks 18 and 20. In one exemplary embodiment, first memory area 18 may correspond to a non-volatile EEPROM memory while second memory area 20 may correspond to a volatile RAM memory. It should be appreciated, however, that both first and second memory areas 18 and 20 may respectively correspond in other exemplary embodiments to various selected types of media, including but not limited to server databases, magnetic tape or disk, CD-ROM, DVD-ROM, EPROMS, other ROM devices, certain types of RAM, namely battery-backed RAM, flash memory, or other storage media.

In further reference to the exemplary memory areas of FIG. 2, first memory area 18 may be located within a metrology processor 16 (See FIG. 1) and used to generally store billing information. The metrology processor or device 16 may be configured to store information representative of the amount of consumed, distributed, and/or metered energy at predetermined "energy increments." As used herein, those of ordinary skill in the art will understand that the terminology "metered" includes and encompasses a subject amount of consumed, distributed, and/or metered quantities of a commodity, such as electricity, water, gas, or oil.

Such energy increments correspond to a unit of measurement that is chosen in accordance with present subject matter so as to be small enough so as to not significantly affect the accuracy of the value being stored. In other words, any potentially lost amount of energy (i.e., data about such energy) will in the worst case be only such managed incremental unit of energy. Such will occur only in the event the attempted storing of such data (i.e., write operation) fails. Write operations may fail for many reasons, including loss of power to a meter as described in the Background of the Invention section, supra. The energy increment unit of measure is also chosen in accordance with the present subject matter so as to be not so small so as to cause the service life of the memory device 18 to be readily exceeded, thus ensuring satisfactory levels of memory endurance.

Referring still to first memory area 18 of FIG. 2, the specific exemplary approach described herein utilizes one-hundred ninety-two (192) respective storage elements of EEPROM memory to store the amount of information required to continuously track energy consumption rates. Such 192 respective storage elements correspond in one example to 8-bit "bytes," although it should be appreciated that alternative elements or element sizes may be utilized in accordance with broader aspects of the present subject matter. One prior algorithm and corresponding system configuration employed 1024 bytes of EEPROM to save the required data because 6 bytes of information representing metered energy was rewritten in its entirety each time new data was written. As will be discussed further, the presently disclosed technology relies on constant save increments and avoids writing the full energy value at each save. Instead, per presently disclosed subject matter, only a single byte (as opposed to six) is saved at each read time to indicate that the energy value has changed by an increment. Such presently disclosed technique allows the power to fail at any point during the write without the loss or corruption of data, and extends the write capabilities of first memory area 18 by a factor of 172 times relative to the previously mentioned prior algorithm that successively saves an entire 6 bytes of data.

Reference will now be made more specifically to the type of information that is stored in first memory area 18 and second memory area 20 represented in FIG. 2. The storage of information in particular portions of such memory areas will also be discussed relative to a series of exemplary process steps that are represented by the flow chart diagram of FIG. 3.

A first portion of information stored in first memory area 18 corresponds to a first energy top value 22. This corresponds to the first nine (9) bytes of data in first memory area 18. A second energy top value 24 corresponds to the last nine bytes of data in first energy storage area 18. Such first and second energy top values are placed at the beginning and the end, respectively, of the EEPROM block due to the architecture of the EEPROM device. By preventing the respective energy top values from occupying immediately adjacent data locations, additional data protection is afforded.

It should be further noted that EEPROM devices can only write items located inside a single page at a given time. A "page" as referred to herein is a memory portion of larger size than that referred to herein as a byte, corresponding to a portion of an EEPROM device of a given size and containing some predetermined number of bytes (or other smaller sized storage elements). Because of the EEPROM write capabilities, first energy top value 22 and second energy top value 24 are placed in different pages within EEPROM 18, thereby protecting such data from corruption during a write attempt, such as might be caused by a power failure or some other reason.

A similar collection of information is stored in each energy top value, an example of which is presently discussed. Six (6) bytes of information in each energy top value, namely, exemplary bytes 28a-38a and 28b-38b, respectively, as represented in present FIG. 2, are used to store information representative of metered energy. In one exemplary embodiment, such metered energy values may be measured and defined in terms of kilo-Watt hours (KWh), as is known and appreciated by those of ordinary skill in the art. The size of such bytes is set such that the energy values will never roll over during the lifetime of the meter.

The first byte 26a or 26b of information in the energy top value portions 22 and 24, respectively, corresponds to a NextCell value, which contains the number which will be written to the energy increment cells 50 each time a predetermined energy threshold level has been crossed. In the exemplary first memory area 18 depicted in FIG. 2, one-hundred seventy-four (174) respective energy increment cells 50 are provided, although this specific number may vary in other embodiments.

Finally, each energy top value portion 22 and 24 contains two respective bytes 40a and 42a or 40b and 42b, which together contain a 16-bit cyclic redundancy check (CRC) value that is used to validate the data contained in each energy top value. An example of an error validation code that may be utilized in accordance with the present technology is a so-called CRC-16 calculation, which is a standard for performing error detection, and which standard is known to those of ordinary skill in the art. While a specific standard is presently disclosed, other specific error-checking or data validation schemes may alternatively be employed, in accordance with broader aspects of the present subject matter.

Figure 3:
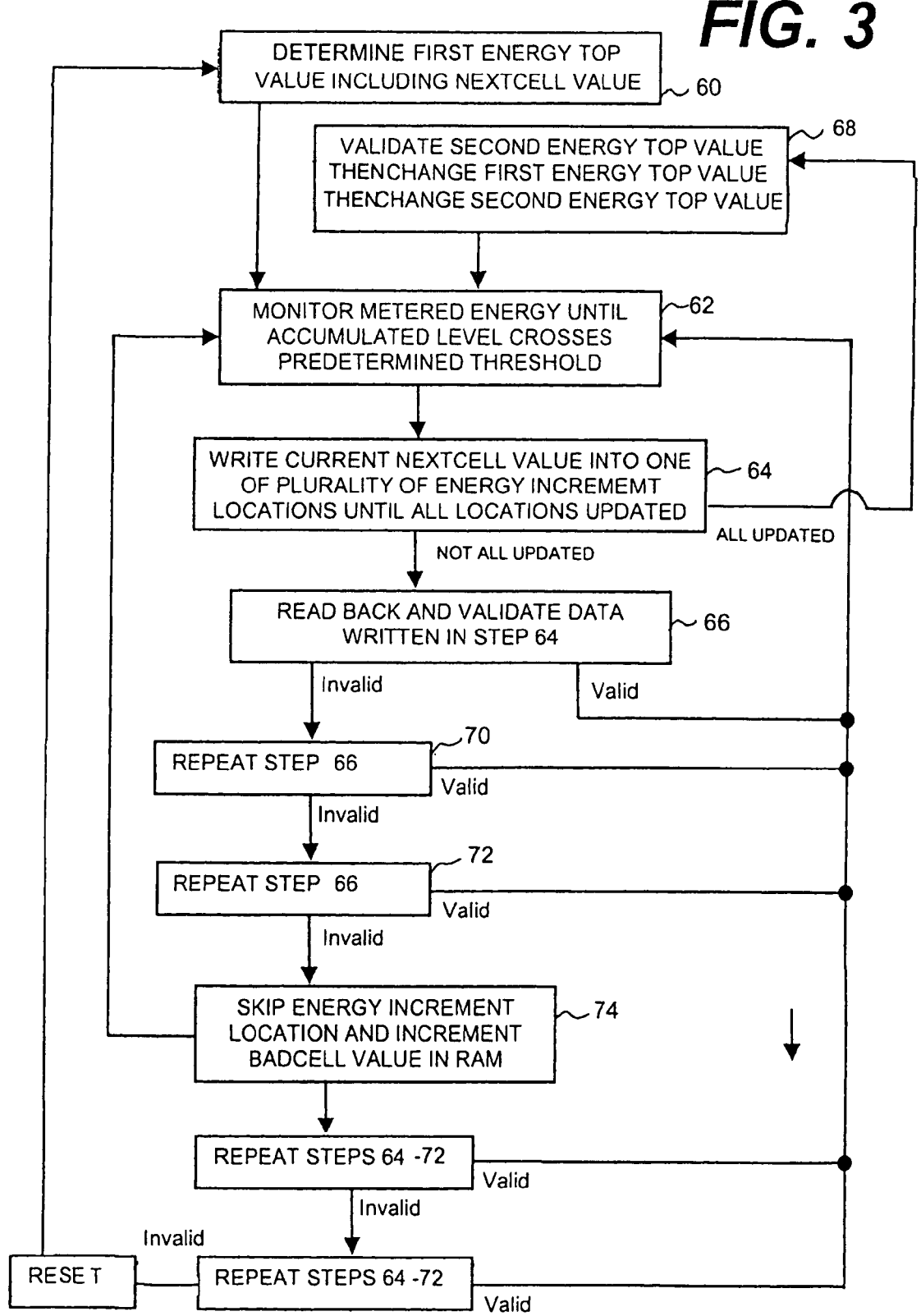
FIG. 3 provides a block flow chart representation of exemplary steps for a data storage algorithm in accordance with aspects of the present subject matter.

Referring now to FIG. 3, a first step 60 in an exemplary data storage algorithm in accordance with the presently disclosed technology is to establish or define the first energy top value, including a NextCell value (to be further discussed in greater detail) that will be stored in location 22. The initial values established in exemplary step 60 of the algorithm (whether as a default or otherwise defined) as represented in FIG. 3, may also be stored in the second energy top value 24. It should be appreciated that such values may not always be identical, as should be understood by those of ordinary skill in the art per additional details disclosed and discussed herein.

The presently disclosed algorithm represented by FIG. 3 proceeds from step 60 thereof to step 62 where during a normal operating mode of a utility meter, the meter will accumulate or track the amount of energy passing through the meter. Such accumulation occurs in the Increment (82) location. When the meter has accumulated enough energy consistent with an energy increment, as previously mentioned, a write to first memory area (EEPROM) 18 will begin. Energy increments are defined by a certain predetermined threshold value. Once the meter has accumulated (or measured) more than such predetermined threshold, the algorithm proceeds from step 62 to exemplary step 64, at which point one of the energy increment cells 50 is written to. The value written to the selected energy increment cell 50 is the value currently stored in NextCell value 26a of first energy top value 22. Each time the energy threshold is crossed, NextCell value 26a is written to another one of the energy increment cells 50 until all energy increment cells 50 have been updated. At any point in the subject algorithm (e.g., when a power down occurs), the present energy value can be determined by reading the either of the energy top value 22 and comparing the NextCell value stored in location 26a or 26b with the value stored in each energy increment cell 50. The algorithm determines which energy top value to use based on the CRC-16 stored in each top value as well as the magnitude of the energy. Referring still to FIGS. 2 and 3, after NextCell value 26a or 26b is read into an energy increment cell 50, such value is then read back from such energy increment cell location and validated in step 66. If such step 66 results in a determination that the energy increment value is valid, then the process proceeds either to step 62 (if additional energy increment cells 50 have yet to be written to or updated) or to step 68 (if all energy increment cells have been either updated or skipped). If the energy increment value is determined in step 66 to be invalid, indicating that the write attempt in step 64 failed, then the write, read, and validation procedures of steps 64 and 66 will be attempted in the example shown up to two additional times (represented by steps 70 and 72). The number of times such attempts are made may vary and such alternatives remain within the spirit and scope of the present subject matter.

If all such three exemplary write attempts fail, the increment location will be skipped per step 74 and a selected storage element in second memory area (RAM) 20, referred to herein as BadCell value 80, is incremented. If, on the other hand, the location was read correctly and determined to be valid in any of steps 66, 70 or 72, then the presently disclosed algorithm will continue until all exemplary 174 respective energy increment cells 50 have been updated with the new next cell value. When the presently disclosed algorithm has updated all such 174 increment cells, the value in the second energy top 24 will be validated in step 68 to contain the old value for the energy top (i.e., that value stored in first energy top 22). The algorithm will then change per step 68 the value in the first energy top location 22. Finally, the algorithm will update the value in the second top 24 with the new value.

Discussion will now be directed more specifically to the determination of values stored in the first and second energy top values 22 and 24, respectively. More particularly, when the first energy top value 22 is updated per step 68 of FIG. 3, the new energy value stored in bytes 28a-38a, respectively, from most significant bit (MSB) to least significant bit (LSB) is determined by Equation (1) as follows:

New_Energy Value =

Previous_Energy_Value + (174 − BadCells) * Energy_Increment_Size where: the parameter Previous_Energy_Value is the value stored in either bytes 28a-38a or in 28b-38b (before being respectively updated in step 68), BadCells is the value stored in RAM location 80 within the second memory area 20, and Energy_Increment_Size is the value determined to correspond to the amount of energy threshold the crossing of which triggers a new energy increment cell write per steps 62 and 64 of FIG. 3.

Referring still to FIG. 2, additional information that may be stored in second memory area (RAM) 20 include an Increment[i] parameter 82, a Pointer value 84 for determining where in a given memory location to read or write energy information, a NextCell value 86 (including information identical to the value in memory locations 26a or 26b), an Energy parameter 88 related to the previous or new energy value calculated as discussed, and a Blurt Energy parameter 90 that may correspond to the value Energy_Top+(Pointer−BadCells)*Energy_Increment_Size.

The NextCell values 26a and 26b in first and second memory areas 22 and 24, respectively, may be defined in a variety of 8-bit configurations. Table One represents an example of a cyclic pattern that may be employed per a present exemplary embodiment.

TABLE ONE

Exemplary States and Corresponding NextCell Values

| State: | NextCell Value: |
|---|---|
| A | 0b01111111 |
| B | 0b10111111 |
| C | 0b11011111 |
| D | 0b11101111 |
| E | 0b11110111 |
| F | 0b11111011 |
| G | 0b11111101 |
| H | 0b11111110 |

In accordance with the pattern represented in such Table One, an initial NextCell state and corresponding value are chosen. The immediately subsequent NextCell value would be an adjacent state (where states A and H are adjacent states). For example, if the subject exemplary algorithm begins with the NextCell value of 0b11101111 (corresponding to state D), the subsequent NextCell value could be selected as either state C or state E. Additional subsequent values would then continue in the direction chosen through the adjacent patterns in the table and continue in a repeating loop. Of course, alternative patterns of rotation could be utilized (e.g., any combination of the states above or combinations or patterns of other values). The above pattern (referred to as a migrating zero pattern) is proposed in accordance with aspects of the present technology because it is the lowest stress on many EEPROM devices to save more 1 than 0 bit values. It should also be noted that a NextCell value of 0b11111111 may be avoided in some embodiments because such value is often defined to be the erase state of a memory area. By avoiding such state, chances will be reduced that an erase is interrupted or is mistaken for an energy update.

It is to be understood by those of ordinary skill in the art that the subject memory integrity process or algorithm may be practiced in various embodiments, including various mixtures of computer software implemented devices and hardwired devices. Those of ordinary skill in the art would be able to put into practice their own selected variations of computer software, firmware, and hardwired implementations of the present subject matter, based on the disclosure in this application (including the specification and Figures thereof). All such modifications and variations are intended to come within the spirit and scope of the present subject matter. Likewise, the foregoing presently preferred embodiments are exemplary only, and their attendant description is likewise by way of words of example rather than words of limitation.

What is claimed is:

1. A method of data storage for a utility meter device that stores metering information, for ensuring the integrity of metering data during power outages, the utility meter device comprising memory components for storing metering data regarding the consumption of a commodity, the memory components having a top value storage cell and a plurality of incremental storage cells, the method comprising:

obtaining and storing, by the utility meter device, initial metering data of the consumed commodity in such top value storage cell of the memory components;

accumulating, by the utility meter device, subsequent metering data at the utility meter device regarding the commodity being consumed;

monitoring, by the utility meter device, such accumulating subsequent metering data at the utility meter device for reaching a predetermined consumption threshold;

updating, by the utility meter device, a predetermined state in an incremental storage cell of the plurality of incremental storage cells once such predetermined consumption threshold is reached, the incremental storage cell being different from the top value storage cell;

repeating, by the utility meter device, the accumulating, monitoring, and updating operations until each of the plurality of incremental storage cells have respectively been updated;

updating, by the utility meter device, the top value storage cell with an updated energy total once each of the plurality of incremental storage cells has been respectively updated; and thereafter repeating, by the utility meter device, the updating of each respective one of the plurality of incremental storage cells.

2. A method as in claim 1, wherein the method further comprises validating one or more of the predetermined state updated in an incremental storage cell and the initial metering data in the top value storage cell.

3. A method as in claim 1, wherein the method further comprises determining if updating of a given incremental storage cell fails, and repeating the update step if updating of a given incremental storage cell fails, and subsequently calculating metering information by accounting for the number of incremental storage cells which are successfully updated and the number thereof which are not.

4. A method as in claim 1, wherein the metering data relates to monitoring the generation, transmission, distribution or consumption of various forms of services, including types of energy or other commodities, including electricity, water, gas, and oil.

5. A method for operation of an electricity meter that ensures the integrity of metering data without the need for power failure detection circuitry or storage capacitance for energy required to complete a non-volatile write after losing normal operating power from a primary source, the electricity meter comprising memory components for storing metering data regarding the consumption of a commodity, such memory components having a designated top value storage cell and an ordered plurality of designated incremental storage cells, such method comprising:

obtaining and storing, by the electricity meter, initial metering data of consumed energy in such top value storage cell of said the memory components;

accumulating, by the electricity meter, subsequent metering data regarding consumed energy at the electricity meter;

monitoring, by the electricity meter, accumulated subsequent metering data at the electricity meter for reaching a predetermined consumption threshold;

updating, by the electricity meter, a predetermined value in a predetermined next one of such plurality of incremental storage cells once such predetermined consumption threshold is reached, the predetermined next one of such plurality of incremental storage cells being different from the top value storage cell;

repeating, by the electricity meter, the accumulating, monitoring, and updating operations until each of the plurality of incremental storage cells have respectively been updated;

updating, by the electricity meter, the top value storage cell with an updated energy total once each of the plurality of incremental storage cells has been respectively updated; and thereafter repeating, by the electricity meter, the updating of each respective one of the plurality of incremental storage cells.

6. A method as in claim 5, wherein the method further comprises validating the initial metering data stored in the top value storage cell, and validating the predetermined value updated in an incremental storage cell.

7. A method as in claim 6, wherein the method further comprises validating the updated top value storage cell.

8. A method as in claim 5, wherein the method further comprises repeating the updating operation for the incremental storage cells if updating of a given incremental storage cell fails, and subsequently calculating metering data by accounting for the number of incremental storage cells which are successfully updated and the number thereof which are not.

9. A method as in claim 5, wherein the period of time between the updating of incremental storage cells is dependent at least in part on the number of the plurality of incremental storage cells employed.

10. A method as in claim 5, wherein a predetermined sequence of the locations of the predetermined next ones of such plurality of incremental storage cells is stored in such memory means.

11. A method as in claim 5, wherein such predetermined values of such incremental storage cells respectively correspond to at least one byte in said memory means.

12. A method as in claim 5, wherein the method further comprises determining that power to the electricity meter has been lost; and determining metering data after a power loss by reading metering data stored in the top value storage cell, and adding to such metering data a value corresponding to the number of updated incremental storage cells times the predetermined consumption threshold.

13. A utility meter with ensured metering data integrity during power outages, comprising:

a processor; and memory components having a designated top value storage cell portion and a portion thereof for a plurality of designated incremental storage cells and further comprising processor executable instructions which when executed by the processor cause the processor to perform the steps of:

obtaining and storing initial metering data of the consumed commodity in such top value storage cell of the memory components;

accumulating subsequent metering data at the utility meter device regarding the commodity being consumed;

monitoring such accumulating subsequent metering data at the utility meter device for reaching a predetermined consumption threshold;

updating a predetermined state in an incremental storage cell of the plurality of incremental storage cells once such predetermined consumption threshold is reached, the incremental storage cell being different from the top value storage cell;

repeating the accumulating, monitoring, and updating operations until each of the plurality of incremental storage cells have respectively been updated;

updating the top value storage cell with an updated energy total once each of the plurality of incremental storage cells has been respectively updated; and thereafter repeating the updating of each respective one of the plurality of incremental storage cells.

14. A utility meter as in claim 13, wherein said metrology processor is further operative for validating one or more of the predetermined state updated in an incremental storage cell and the initial metering data in the top value storage cell.

15. A utility meter as in claim 13, wherein said metrology processor is further operative for determining if updating of a given incremental storage cell fails, and repeating the update operations thereof if updating of a given incremental storage cell fails, and subsequently calculating metering information by accounting for the number of incremental storage cells which are successfully updated and the number thereof which are not.

16. A utility meter as in claim 13, wherein:

said plurality of designated incremental storage cells comprise an ordered plurality of designated incremental storage cells; and said metrology processor is operative for metering consumed energy in predetermined increments and for operating to repeat said accumulating, monitoring, and updating operations thereof until each of said plurality of incremental storage cells have respectively been updated; and further for operating to update said top value storage cell portion with an updated energy total once each of said plurality of incremental storage cells has been respectively updated; and operative thereafter for repeating the updating of each respective one of said plurality of incremental storage cells.

17. A utility meter as in claim 16, wherein:

said metrology processor includes an algorithm-based implementation of operations thereof, implemented in one of software, firmware, hardwired, and mixtures thereof; and said utility meter is one of a single phase and multi phase meter.

18. A utility meter as in claim 16, wherein said metrology processor is further operative for updating said ordered incremental storage cells in a predetermined sequence thereof, which sequence is stored in said memory components.

19. A utility meter as in claim 13, wherein said metering consumption relates to monitoring the generation, transmission, distribution and/or consumption of various forms of services, including types of energy or other commodities, including electricity, water, gas, and oil.

20. A utility meter as in claim 13, wherein said utility meter comprises an electronic electricity meter, and said metrology processor comprises metrology means of said electronic electricity meter, for metering consumed energy in predetermined increments and for producing corresponding metering data, with such meter configured to receive power input from one of a power grid and a power distribution system, and further having an electronic register for outputting electricity meter quantities or data, including metering data including at least one of load profiles, energy data, time-of-use data, informational data, error/event/history logs, and self-reads, with such data being collected and stored for later retrieval by at least one of authorized field personnel and transmission to a location remote from such meter.

21. A utility meter as in claim 13, wherein said memory components include at least one of non-volatile EEPROM memory, volatile RAM memory, server databases, magnetic tape, magnetic disk, CD-ROM, DVD-ROM, EPROMS, other ROM devices, battery-backed RAM, flash memory, and other storage media.

22. A utility meter as in claim 13, wherein such predetermined state of said incremental storage cells respectively correspond to at least one byte in said memory components.

23. A utility meter as in claim 13, wherein such memory components include an EEPROM device, and wherein the initial metering data stored in said top value storage cell portion thereof and the update thereof are stored in different pages of said EEPROM device, to protect against data corruption during a power outage, where a page of said EEPROM device comprises a portion of such device having a given size and containing some predetermined number of bytes.

24. A utility meter as in claim 13, wherein said metrology processor is further operative for determining that power to the utility meter has been lost; and determining metering data after a power outage by reading metering data stored in said top value storage cell portion, and adding to such metering data a value corresponding to the number of updated incremental storage cells times the predetermined consumption threshold.

25. A method as in claim 1, the method further comprising establishing a predetermined numerical value and storing the predetermined numerical value in the top value storage cell; and wherein updating a predetermined state in an incremental storage cell comprises writing the predetermined numerical value stored in the top value storage cell to the incremental storage cell.

* * * * *